US012763139B2

(12) United States Patent
Pries et al.

(10) Patent No.: US 12,763,139 B2
(45) Date of Patent: Oct. 13, 2026

(54) METHOD OF OPERATING AN ELECTRICALLY PROGRAMMABLE MEMORY CELL WITH A CHALCOGENIDE FOR MULTI-LEVEL DATA STORAGE

(71) Applicant: RHEINISCH-WESTFÄLISCHE TECHNISCHE HOCHSCHULE (RWTH) AACHEN, Aachen (DE)

(72) Inventors: Julian Pries, Aachen (DE); Matthias Wuttig, Aachen (DE); Christian Stenz, Aachen (DE)

(73) Assignee: RHEINISCH-WESTFAÄLISCHE TECHNISCHE HOCSCHULE (RWTH) AACHEN, Aachen (DE)

( * ) Notice: Subject to any disclaimer, the term of this patent is extended or adjusted under 35 U.S.C. 154(b) by 231 days.

(21) Appl. No.: 18/294,434

(22) PCT Filed: Jul. 29, 2022

(86) PCT No.: PCT/EP2022/071304

§ 371 (c)(1),
(2) Date: Feb. 1, 2024

(87) PCT Pub. No.: WO2023/025514

PCT Pub. Date: Mar. 2, 2023

(65) Prior Publication Data

US 2024/0331769 A1 Oct. 3, 2024

(30) Foreign Application Priority Data

Aug. 23, 2021 (DE) ......................... 102021121750.4

(51) Int. Cl.
*G11C 13/00* (2006.01)

(52) U.S. Cl.
CPC ...... *G11C 13/0004* (2013.01); *G11C 13/0033* (2013.01); *G11C 13/0069* (2013.01)

(58) Field of Classification Search
CPC ............ G11C 13/0004; G11C 13/0033; G11C 13/0069; G11C 11/5678; G11C 13/0035
See application file for complete search history.

(56) References Cited

U.S. PATENT DOCUMENTS 8,948,998 B2 * 2/2015 Smith ................... F02D 31/001 123/399
9,406,056 B2 * 8/2016 MacKay ............. G06K 7/0004
(Continued)

OTHER PUBLICATIONS

Zhang et al., "Unveiling the structural origin to control resistance drift in phase-change memory materials", Materials Today, 2020, pp. 156-176.
(Continued)

*Primary Examiner* — Tuan D Nguyen
(74) *Attorney, Agent, or Firm* — Chiesa Shahinian & Giantomasi PC

(57) ABSTRACT

A method of operating an electrically programmable memory cell comprising a chalcogenide for multi-level data storage, the method comprising providing a pulse signal associated with a first predetermined temperature level to the memory cell to adjust a resistance state according to the first predetermined temperature level; providing a pulse signal associated with a second predetermined temperature level to the memory cell to reset the resistance drift in the chalcogenide, which resistance drift has occurred since the providing the pulse signal associated with the first predetermined temperature level; and the first and second predetermined temperature levels are each greater than a glass transition temperature ($T_g$) of the chalcogenide.

9 Claims, 2 Drawing Sheets

(56) References Cited

U.S. PATENT DOCUMENTS

| | | | | |
|---|---|---|---|---|
| 9,552,896 | B2 * | 1/2017 | Oh | G11C 29/52 |
| 9,558,823 | B1 | 1/2017 | Khwa et al. | |
| 10,643,705 | B2 * | 5/2020 | Choi | G11C 13/004 |
| 11,526,285 | B2 * | 12/2022 | Wang | G06N 3/084 |
| 2010/0182826 | A1 | 7/2010 | Czubatyj | |
| 2011/0302354 | A1 * | 12/2011 | Miller | G11C 16/22 711/E12.001 |
| 2012/0262984 | A1 | 10/2012 | Savransky et al. | |
| 2014/0219001 | A1 | 8/2014 | Patapoutian et al. | |
| 2018/0108408 | A1 | 4/2018 | Kwon | |

OTHER PUBLICATIONS

Pries et al., "Switching between crystallization from the glassy and the undercooled liquid phase in the phase change material Ge2Sb2Te5", Advanced Functional Materials, 2019, pp. 1-9.
International Search Report mailed Nov. 25, 2022 in connection with International Application No. PCT/EP2022/071304, 16 pgs. (including translation).

* cited by examiner

METHOD OF OPERATING AN ELECTRICALLY PROGRAMMABLE MEMORY CELL WITH A CHALCOGENIDE FOR MULTI-LEVEL DATA STORAGE

CROSS-REFERENCE TO RELATED APPLICATIONS

This application is a national stage of International Patent Application Serial No. PCT/EP2022/071304, filed Jul. 29, 2022, which claims priority to German Patent Application No. 102021121750.4, filed Aug. 23, 2021, the disclosures of all are incorporated herein by reference in their entirety.

BACKGROUND

The invention relates to a method for operating an electrically programmable memory cell with a chalcogenide for multi-level data storage with the features of the preamble of claim 1 as well as a controller for operating an electrically programmable memory cell with a chalcogenide for binary or also multi-level data storage as well as a data storage with the same.

Basically, the problem in the prior art is that after a phase change memory element has been programmed to a particular resistance state (e.g., a low resistance or SET state, a high resistance or RESET state, or an intermediate state between the SET/RESET states), the resistance value associated with the resistance state may drift with time, resulting in an increase in resistance with time, also referred to as resistance drift. Such resistance drift can lead to a problem in distinguishing between resistance states, especially if the storage device is a multi-level data storage where multiple states are to be distinguished.

The object of the invention is to improve the prior art, particularly with regard to the effect of resistance drift.

SUMMARY

According to the invention, this object is achieved by the features of the independent claims.

Specifically, the object is achieved by a method for operating an electrically programmable memory cell. The memory cell has or consists of a chalcogenide and is intended or adapted for multi-level data storage. The memory cell can explicitly be a multi-level cell (MLC). The chalcogenide may include at least the group of phase-change materials. The method comprises providing a pulse signal associated with a first predetermined temperature level to the memory cell for adjusting a resistance state, in particular for realizing a binary or non-binary bit, according to the first predetermined temperature level. In other words, the pulse signal associated with the first predetermined temperature level may be adapted to generate different non-binary memory states in the memory cell. The method further comprises providing a pulse signal associated with a second predetermined temperature level to the memory cell for resetting a resistance drift in the chalcogenide that has occurred since the pulse signal associated with the first predetermined temperature level was provided. Here, both the first and second predetermined temperature levels are greater than a glass transition temperature of the chalcogenide.

The invention has the advantage that the resistance drift can be reset and the resistance state set by means of the pulse signal associated with the first predetermined temperature level can be read correctly in a subsequent read operation.

Advantageous embodiments of the invention are indicated in the dependent claims.

The chalcogenide can be crystalline chalcogenide. The chalcogenide may be a partially amorphous chalcogenide or an amorphous chalcogenide. The chalcogenide may form a Phase Change Material (PCM) for mapping the resistance state, for example a PCM such as GeTe, $Sb_2Te_3$, Ge $Sb_{22}$ $Te_5$, $Ge_{15}Te_{85}$ or $Sb_2Te$ and its doped forms. A PCM can be determined by the fact that it can be present in an application in the amorphous and/or crystalline phase and these two phases are significantly different for the specific application in physical properties such as reflectivity and resistivity. A PCM is used if the switching times (for amorphization and crystallization) are not too long.

The chalcogenide containing a chalcogen element may include Te, Se, S, O and/or alloys thereof. The chalcogenide may further include Ge, Sb, Bi, Pb, Sn, As, N, C, Si, P, Ag, In, Ga and/or Cr or alloys thereof and/or other elements. Similarly, the chalcogenide may comprise Ge, Te, Sb and combinations thereof. For example, the chalcogenide may consist of GeTe, Ge $Sb_{22}Te_5$, $GeSb_2Te_4$, $Sb_2Te_3$, $Sb_2Te$, $GeSb_{x1-x}$ or similar or doped compounds.

The glass transition temperature of the chalcogenide can be material-dependent. In particular, the glass transition temperature can be in a range between 10° and 300° C., preferably greater or less than 150°, 175°, 200°, 225° or 250°. The glass transition temperatures for Ge $Sb_{22}$ $Te_5$, GeTe and AIST can correspond to approximately 200° C., 190° C. and 182.5° C. The melting temperature of the chalcogenide can also be material dependent. In particular, the melting temperature may be in a range between 55° and 750° C., preferably greater or less than 550°, 575°, 600°, 625° or 650°. A special case can form $Ge_{15}Te_{85}$, in which the glass transition temperature is around 120° C. and the melting temperature is around 375° C. However, this example does not represent a limitation in any form.

Amorphous chalcogenides, including PCMs, show a drift (continuous increase) in resistance with time. This drift changes (increases) the resistance of the state stored in a data storage, which can include from 0% to 100% amorphous volume part, with the rest of the volume being crystalline, so that after a certain time the correct state is distorted and ultimately can no longer be read out correctly.

Using the method described herein, the resistance drift can be reset so that the original state can be read out correctly.

The pulse signal associated with the first predetermined temperature level can represent a write operation on the memory cell. The write operation is used to adjust the resistance state. The pulse signal associated with the second predetermined temperature level can represent a reset operation on the memory cell. The reset operation can be performed independently of the write operation. The reset operation can be performed before a read operation, for example immediately before. For this purpose, the method may comprise providing a pulse signal associated with a third predetermined temperature level to the memory cell for reading out the resistance state set by the pulse signal associated with the first predetermined temperature level. The pulse signal associated with the third predetermined temperature level may represent the read operation. The read operation may follow the write operation in time. The read operation is used to read out the resistance state set by the write operation. The third predetermined temperature level can be significantly lower than the first and second predetermined temperature levels, as only heat is generated here secondarily by providing the current and voltage required for the read.

For example, the reset operation to zero the resistance drift and the read operation can be performed several times in succession without having to perform another write operation on the memory cell or bit as described above after the respective read operation.

Thus, a memory cell can be provided that can be largely independent of the historically induced resistance drift.

The first, second and third predetermined temperature levels can differ from each other. Thus, the corresponding electrical or optical pulse signals, in particular with their respective influence on the first, second and third predetermined temperature levels, can also differ from each other. In this case, the first predetermined temperature level can be greater than the second predetermined temperature level and the third predetermined temperature level. Further, the second predetermined temperature level may be greater than the third predetermined temperature level. For example, the first predetermined temperature level can be at least 5 times (or 10 times) greater than the second predetermined temperature level. For example, the second predetermined temperature level can be at least 5 times (or 10 times) greater than the third predetermined temperature level.

The pulse signal associated with the first predetermined temperature level may be shorter in time than the pulse signal associated with the second and/or third predetermined temperature level. For example, the pulse signal associated with the first predetermined temperature level may be at least 5 times (or 10 times or 50 times) shorter than the pulse signal associated with the second and/or third predetermined temperature level. Similarly, the pulse signal associated with the third predetermined temperature level may be shorter than the pulse signal associated with the first and/or second predetermined temperature level.

The first predetermined temperature level can be greater than the melting temperature of the chalcogenide. The second predetermined temperature level can be lower than the melting temperature of the chalcogenide. The second predetermined temperature level is, for example, in the range of or greater than the glass transition temperature. This allows the amorphous material to transition into supercooled/subcooled liquid and a history of the glass to be erased, as the glass phase is extinguished. When the pulse signal associated with the second predetermined temperature level is switched off, the amorphous material can cool and a new glass phase is formed in the amorphous material as it cools. The third predetermined temperature level can be lower than the glass transition temperature of the chalcogenide.

The pulse signals associated with the first, second and/or third predetermined temperature levels can be applied in the form of a rectangular pulse. The rectangular pulse can deviate from an ideal rectangular pulse in such a way that an edge steepness lies in a range of e.g. $10^8$ K/s to $10^{10}$ K/s or more.

For example, a pulse signal duration of the pulse signal associated with the second predetermined temperature level is dependent on the second predetermined temperature level or the magnitude of the second predetermined temperature level. For example, a pulse signal duration of the pulse signal associated with the second predetermined temperature level may be inversely proportional to the second predetermined temperature level or to the magnitude of the second predetermined temperature level. The pulse signal associated with the second predetermined temperature level may be provided such that a pulse signal duration of the pulse signal associated with the second predetermined temperature level is greater the closer the second predetermined temperature level is to the glass transition temperature and the further away it is from the melting temperature of the chalcogenide. Thus, the pulse signal duration of the pulse signal associated with the second predetermined temperature level may be set anti-proportionally to the second predetermined temperature level or to the magnitude of the second predetermined temperature level. In other words, a pulse signal with a higher temperature may be shorter than a pulse signal with a lower temperature.

The above object is also achieved by a computer program. The computer program comprises instructions/commands which, when the program is executed by a computer, cause the computer to perform the method or the steps of the method as described above.

The above object is also achieved by a computer-readable data carrier. The computer program as described above is stored on the computer-readable data carrier.

The above object is also achieved by a controller for operating an electrically programmable memory cell having a chalcogenide for multi-level data storage. The controller is configured to provide a pulse signal associated with a first predetermined temperature level to the memory cell for adjusting a resistance state, preferably by adjusting a ratio between an amorphous volume to a crystalline volume in the chalcogenide, according to the first predetermined temperature level. The controller is further configured to provide a pulse signal associated with a second predetermined temperature level to the memory cell for resetting the resistance drift in the chalcogenide that has occurred since the providing of the pulse signal associated with the first predetermined temperature level. The first and second predetermined temperature levels are each greater than a glass transition temperature of the chalcogenide.

The above object is also achieved by a data storage for multi-level applications with an electrically programmable memory cell having a chalcogenide. The data storage has a controller, which may correspond to or include the above controller. The controller is configured to provide a pulse signal associated with a first predetermined temperature level to the memory cell for adjusting a resistance state according to the first predetermined temperature level. The controller is further configured to provide a pulse signal associated with a second predetermined temperature level to the memory cell for resetting the resistance drift in the chalcogenide that has occurred since the providing of the pulse signal associated with the first predetermined temperature level. The first and second predetermined temperature levels are each greater than a glass transition temperature of the chalcogenide.

In principle, a set resistance state is obtained as follows. A certain resistance can assume a value between that of an amorphous phase of the chalcogenide (resistance value R high) and that of a crystalline phase of the chalcogenide (resistance value R low) by adjusting the ratio between the crystalline phase and the amorphous phase in the write operation described herein. Once a predetermined portion of amorphous phase is adjusted by the write operation, the amorphous phase will assume a higher resistance with time, so that the resistance of the entire bit increases with time, but without affecting the ratio between the amorphous and crystalline phases of the chalcogenide. The reset operation described herein changes the ratio of the amorphous and crystalline phases of the chalcogenide insignificantly. The reset operation differs from the conventional operation in which the RESET state is adjusted as described above.

A pulse signal described herein may be an excitation pulse. This excitation pulse can be a current/voltage pulse or an optical pulse, by which the chalcogenide is completely or partially amorphized. By raising the temperature above the melting temperature of the chalcogenide and abrupt cooling, crystallization of the chalcogenide can be completely or partially bypassed and the bit can be amorphous or partially amorphous. The corresponding resistance state can then be determined by the ratio of amorphous to crystalline volume parts (as the resistance is high in the amorphous volume part and low in the crystalline volume part).

The pulse signals associated with the first, second and/or third predetermined temperature levels may be electrical signal pulses which have a current amplitude or voltage amplitude corresponding to the corresponding first, second and/or third predetermined temperature level. The pulse signals associated with the first, second and/or third predetermined temperature levels can essentially be square-wave pulses. Exactly one pulse signal can be provided per operation, in particular write operation, reset operation and/or read operation.

Thus pulse signals are provided that have corresponding temperature levels. The pulse signals may thus be electrical pulses according to voltage/current settings and applied to the memory cell by means of electrodes attached to the memory cell. The pulse signals may have a temperature level corresponding to the operation for a pulse signal duration associated with the first, second and/or third predetermined temperature level. The pulse signal duration of the pulse signal associated with the first, second and/or third predetermined temperature level may be preset inversely proportional to the amplitude of the pulse signal associated with the first, second and/or third predetermined temperature level. The pulse signal duration of the pulse signal associated with the first predetermined temperature level can be 5 times (or 10 times) shorter than the pulse signal duration of the pulse signal associated with the second predetermined temperature level. Similarly, the pulse signal duration of the pulse signal associated with the second predetermined temperature level can be 5 times (or 10 times) shorter than the pulse signal duration of the pulse signal associated with the third predetermined temperature level.

Herein, the first, second and/or third predetermined temperature level is a temperature present in or at the memory cell during the providing (or when providing) of the corresponding pulse signal associated with the first, second and/or third predetermined temperature level.

In other words, the invention relates to a method for reversing resistance drift in amorphous chalcogenides.

The amorphous phase of chalcogenides shows a continuous increase in electrical resistance over time. This is a problem in electrical data storages based on Phase-change material (PCM), a subgroup of chalcogenides.

PCMs can include tellurium, antimony and/or germanium, although other compounds are also possible, such as PbSe. It is characteristic of PCMs that they exhibit a clear contrast in electrical conductivity and optical reflectivity between the amorphous and crystalline phases. This difference makes it possible to store binary data, coded as “0” and “1”. Since the difference in electrical conductivity in PCMs is often several orders of magnitude, it is possible to store different intermediate states (multiple levels) by adjusting the degree of crystallization of a memory cell, with the rest of the cell remaining in the amorphous state. Multi-level memory cells have great potential in advanced computing operations, such as neuromorphic computing, image recognition and artificial intelligence. The resistance drift of the amorphous phase is already noticeable in binary memories; in multi-level memory cells, however, it can lead after a short time to the fact that stored values can no longer be clearly assigned, but higher values are erroneously read out. With the method described herein to solve this problem, the increased resistance of the memory cell due to resistance drift can be reset in order to be able to reliably read out (binary and multi-level) PCM memories. The method described herein enables the implementation of resistance drift corrected multi-level data storages based on PCMs. Since resistance drift occurs not only in amorphous PCMs but in amorphous chalcogenides in general, the present invention can be applied to PCMs as well as to amorphous and partially amorphous chalcogenides in general.

In other words, the problem of resistance drift can be solved by raising the temperature above the temperature of the glass state (glass transition temperature) before the read-out and the material is transferred to the undercooled liquid (UCL), also known as supercooled liquid (SCL), which resets the ageing of the glass and thus the resistance change that previously occurred. The glass is thus rejuvenated without changing the degree of crystallization. This allows the drift to be reset and the state to be read out error-free and drift-corrected, so that PCM-based multi-level data storage can be used reliably in applications such as neuromorphic computing, image recognition and artificial intelligence.

For example, the resistance drift minimization method described herein does not involve changing the active PCM in the memory cell, which would affect long-term storage capability, or complicated memory cell design. Thus, industrial manufacturing of PCM-based binary and multi-level memory cell (MLC) memory chips may be easier to implement. For example, the PCM and memory cell used can remain unchanged according to the present method, eliminating the need for modifications in the manufacturing process, saving money and time. Furthermore, a required heat input to reset the resistance drift can be done by an already existing control technique, especially the controller described herein, to write the multi-level states, so that only minimal adaptations to the control technique need to be performed.

It will be understood by the skilled person that the embodiments set forth herein may be implemented using hardware circuitry, software means, or a combination thereof. The software means may also be associated with programmed microprocessors or a general purpose computer, an ASIC (Application Specific Integrated Circuit) and/or DSPs (Digital Signal Processors).

For example, the controller and the data storage can be partially realized as a computer, a logic circuit, an FPGA (Field Programmable Gate Array), a processor (for example comprising a microprocessor, a microcontroller (μC) or a vector processor), a core (can be integrated in the processor or used by the processor) and/or a CPU (Central Processing Unit, whereby several processor cores are possible).

In further examples, the controller and the data storage can be partially realized as an FPU (Floating Point Unit), an NPU (Numeric Processing Unit), and/or an ALU (Arithmetic Logical Unit).

In a still further exemplary embodiment, the controller and the data storage may be partially realized as a coprocessor (additional microprocessor to support a main processor (CPU)), a GPGPU (General Purpose Computation on Graphics Processing Unit), a parallel computer (for simultaneously performing, inter alia on several main processors and/or graphics processors, arithmetic operations) and/or a DSP.

In the controller and the data storage, for example, methods can be used that are associated with pipelining. Here, instead of an entire command being processed in one clock cycle of the processor, only a subtask is processed. The various subtasks of several commands are processed simultaneously. Further, methods in the sense of multithreading and further developments thereof can be used, for example simultaneous multithreading. This makes it possible to achieve better utilization of the computing units by using several processor cores in parallel. The controller and the data storage can be scalar or superscalar.

However, the controller and data storage should not be limited to the aforementioned.

Even if some of the aspects described above have been described in relation to the method, these aspects can also apply to the controller and the data storage. In the same way, the aspects described above in relation to the data storage and the controller may apply to the method in a corresponding manner.

It is also understood that the terms used herein are intended only to describe individual embodiments and are not intended to be limiting. Unless otherwise defined, all technical and scientific terms used herein have the meaning that corresponds to the general understanding of the skilled person in the technical field relevant to the present disclosure; they are to be understood neither too broadly nor too narrowly. If technical terms are used incorrectly in the present disclosure and thus do not express the technical idea of the present disclosure, they are to be replaced by technical terms which convey a correct understanding to the skilled person. The general terms used in the present disclosure are to be interpreted based on the definition found in the dictionary or in accordance with the context; an overly narrow interpretation is to be avoided.

BRIEF DESCRIPTION OF THE DRAWINGS

The invention is explained in more detail by means of embodiments with reference to the attached schematic drawings with further details.

In the drawings.

DETAILED DESCRIPTION OF THE DRAWINGS

Figure 1:
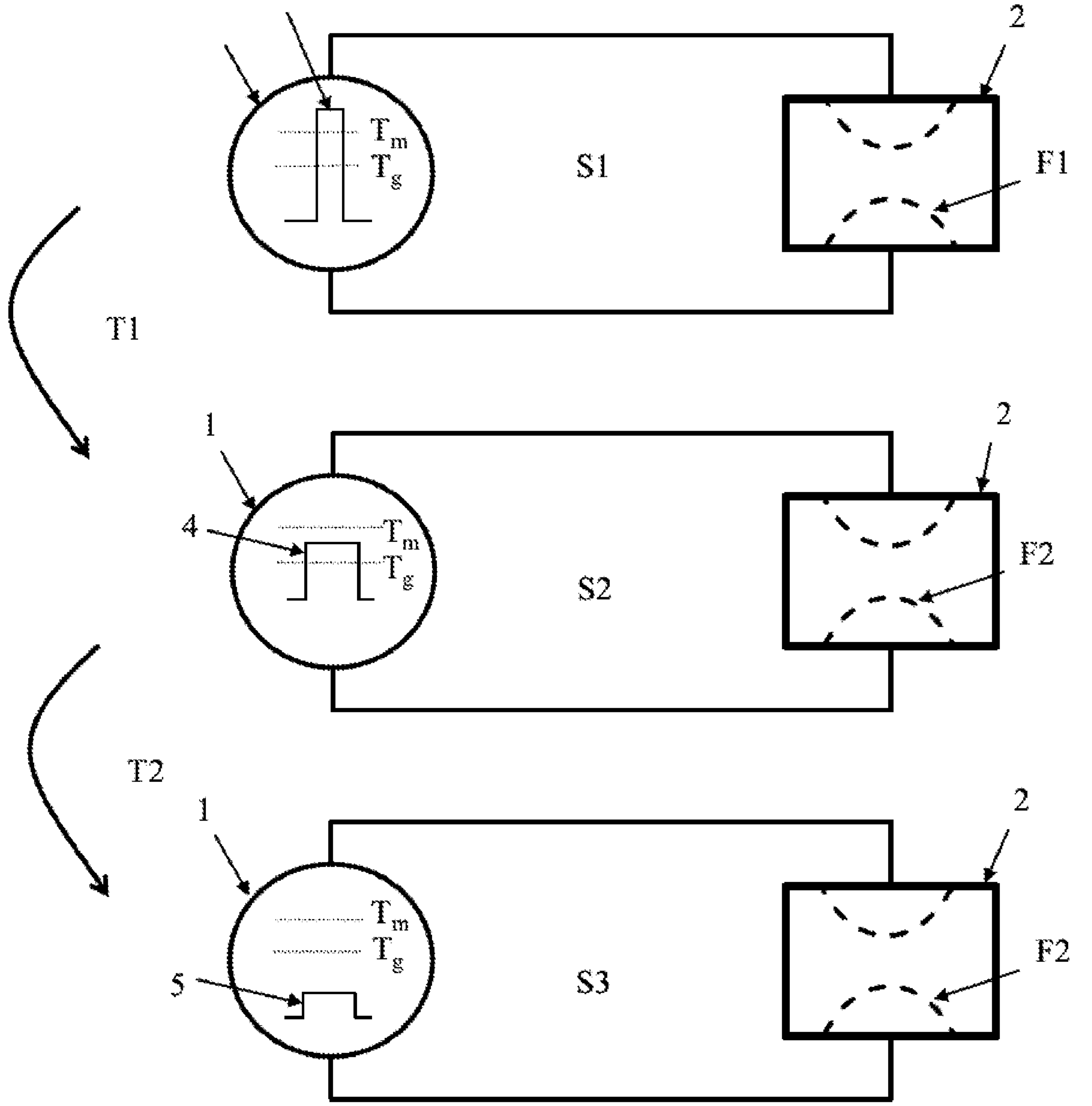
FIG. 1 shows an arrangement of a controller and a memory cell for describing the method of operating the same disclosed herein.
Figure 2:
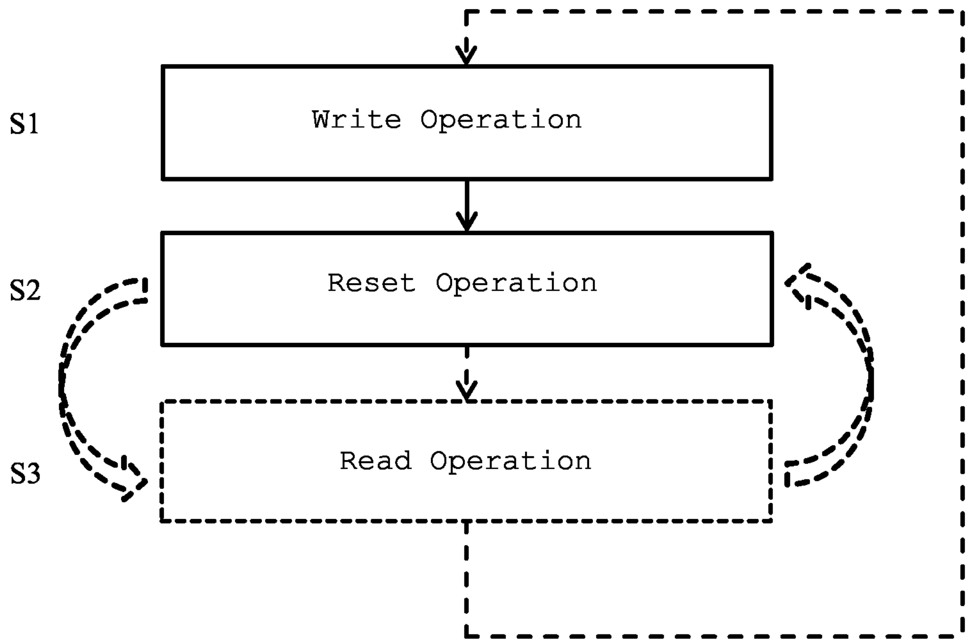
FIG. 2 shows a method of operating a memory cell.

FIGS. 1 and 2 describe the underlying principle of the present invention. Here, an electrical pulse signal (voltage/current pulse) with a predetermined amplitude is applied to a memory cell 2 by means of a controller 1. Based on a heat input to the memory cell 2 generated by means of the electrical signal, the volume part of the amorphous phase can be adjusted as desired, i.e. between 0% and 100% (exemplarily and schematically shown as volume part F1), whereby the non-amorphous volume part is present in a crystalline phase.

In a first step S1, a write pulse 3 may be applied to the memory cell 2 as the electrical signal. The write pulse 3 may have a temperature level intended for heat input, which is given as an amplitude in FIG. 1. The temperature level intended for heat input is determined by the electrical variable(s), voltage or current, of the electrical pulse signal applied to the memory cell 2.

To adjust a resistance value in the memory cell 2, a write pulse 3 is selected which temperature level is above both the glass transition temperature $T_g$ and the melting temperature $T_m$ of the material used in the memory cell 2, in this case amorphous chalcogenide. The size (amplitude) and the pulse signal duration as well as the edge shape of the write pulse 3 determine the resistance state and thus the resistance value of the memory cell 2. In FIG. 1, for example, the volume part F1 of the amorphous phase is shown, which reflects the resistance state after the application of the write pulse 3. The write pulse 3 can, for example, have an edge steepness of about $10^9$ K/s and a duration of about 100 ps, but can also be significantly longer or shorter, depending on the memory cell structure.

With time T1 after the first step S1, the resistance drift in the memory cell 2 will increase, towards higher resistance values. The resistance drift does not change the volume part F1 of the amorphous phase, as shown schematically in FIG. 1. Only the electrical properties of the amorphous phase change over time. The amorphous volume part F1 has the resistance drift over time and thus has a higher electrical resistance value R. Different programmed resistance states are generated by creating different amorphous volume parts (not shown) which amorphous volume part essentially remain the same but show an increase in electrical resistance over time.

Regardless of the time T1, in a second step S2, a reset pulse 4 following the write pulse 3 can be provided as the electrical signal by the controller 1 to the memory cell 2. The reset pulse 4 serves to reverse the resistance drift and restore the resistance state that was present in the memory cell 2 directly after providing the write pulse 3. To restore the resistance value in the memory cell 2, a reset pulse 4 is selected which temperature level lies in a range between the glass transition temperature $T_g$ and the melting temperature $T_m$ of the material used in the memory cell 2, in this case amorphous chalcogenide. The reset pulse 4 can, for example, have a similar edge steepness as the write pulse 3. However, the duration of the reset pulse 4 can be 10 times (or 50 times) longer, for example about 10 ns. The duration of the reset pulse 4 can be determined depending on its temperature level. For example, a higher temperature level may have a shorter reset pulse 4. Conversely, a lower temperature level can have a longer reset pulse 4. After applying the reset pulse 4, the amorphous phase in the volume part F2 can be set, which essentially corresponds to the amorphous phase in the volume part F1 (from an electrical perspective), which was adjusted after the write pulse 3. The temperature is selected in such a way that the amorphous and crystalline volume parts are changed insignificantly and the volume parts F1 and F2 remain essentially the same. This applies in particular below the melting temperature $T_m$.

After a time T2, in a third step S3, a read pulse 5 can be provided as the electrical signal by the controller 1 to the memory cell 2. The times T1 and T2 do not depend on each other. However, the time T2 can be omitted completely and the read pulse 5 can directly follow the reset pulse 4. However, the time T2 can also be limited to a maximum time threshold value in order to minimize the resistance drift associated with the time T2 and to avoid ambiguities between resistance values. Here, for example, the time T2 can be limited to 1 ms. For example, the read operation S3 can always be carried out in conjunction with the reset operation S2 in order to achieve optimum resistance resolution.

At this point, it should be noted that all the parts described above are claimed to be essential to the invention when viewed individually and in any combination, in particular the details shown in the figures. Modifications thereof are familiar to the skilled person.

LIST OF REFERENCE NUMBERS

1 Controller
2 memory cell
3 write pulse
4 reset pulse
5 read pulse
T1 first time interval
T2 second time interval
F1 amorphous volume part after write pulse
F2 amorphous volume part after T1 and T2
$T_m$ melting temperature
$T_g$ glass transition temperature

The invention claimed is:

1. A method of operating an electrically programmable memory cell having a chalcogenide for multi-level data storage, the method comprising:
- providing a pulse signal associated with a first predetermined temperature level to the memory cell to adjust a resistance state according to the first predetermined temperature level; and
- providing a pulse signal associated with a second predetermined temperature level to the memory cell to reset resistance drift in the chalcogenide that has occurred since the providing of the pulse signal associated with the first predetermined temperature level,
- wherein the first and second predetermined temperature levels are each greater than a glass transition temperature of the chalcogenide and the second predetermined temperature level is lower than the melting temperature of the chalcogenide.

2. The method of claim 1, wherein the chalcogenide is a crystalline, amorphous or partially amorphous chalcogenide.

3. The method of claim 1, wherein the pulse signal associated with the first predetermined temperature level represents a write operation on the memory cell, and the pulse signal associated with the second predetermined temperature level represents a reset operation on the memory cell, which reset operation is performed independently of the write operation but before a read operation which follows the write operation in time in order to read out the resistance state set by the write operation.

4. The method of claim 1, wherein the chalcogenide forms phase change material to map the resistance state.

5. The method of claim 1, wherein the first predetermined temperature level is greater than a melting temperature of the chalcogenide.

6. A computer program including commands which, when the program is executed by a computer, cause the computer to perform the method or the steps of the method of claim 1.

7. A non-transitory computer-readable data carrier storing thereon the computer program of claim 6.

8. A controller for operating an electrically programmable memory cell having a chalcogenide for multi-level data storage, wherein the controller is configured to:
- provide a pulse signal associated with a first predetermined temperature level to the memory cell to adjust a resistance state according to the first predetermined temperature level; and
- provide a pulse signal associated with a second predetermined temperature level to the memory cell to reset resistance drift in the chalcogenide that has occurred since the providing the pulse signal associated with the first predetermined temperature level,
- wherein the first and second predetermined temperature levels are each greater than a glass transition temperature of the chalcogenide and the second predetermined temperature level is lower than the melting temperature of the chalcogenide.

9. A data storage for multi-level applications comprising an electrically programmable memory cell having a chalcogenide and the data storage has a controller configured to:
- provide a pulse signal associated with a first predetermined temperature level to the memory cell to adjust a resistance state according to the first predetermined temperature level; and
- provide a pulse signal associated with a second predetermined temperature level to the memory cell to reset resistance drift in the chalcogenide that has occurred since the providing the pulse signal associated with the first predetermined temperature level,
- wherein the first and second predetermined temperature levels are each greater than a glass transition temperature of the chalcogenide and the second predetermined temperature level is lower than the melting temperature of the chalcogenide.

* * * * *